United States Patent
Kang et al.

(10) Patent No.: US 7,589,998 B2
(45) Date of Patent: Sep. 15, 2009

(54) NON-VOLATILE MEMORY DEVICE AND METHOD OF OPERATION THEREFOR

(75) Inventors: Dong-Ku Kang, Seongnami-si (KR); Hee-Won Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 171 days.

(21) Appl. No.: 11/651,990

(22) Filed: Jan. 11, 2007

(65) Prior Publication Data
US 2007/0171711 A1    Jul. 26, 2007

(30) Foreign Application Priority Data
Jan. 24, 2006    (KR) .................... 10-2006-0007406

(51) Int. Cl.
G11C 11/34  (2006.01)
G11C 16/04  (2006.01)
G11C 7/10   (2006.01)

(52) U.S. Cl. .................... 365/185.05; 365/185.03; 365/185.12; 365/189.05

(58) Field of Classification Search ............ 365/185.03, 365/189.05
See application file for complete search history.

(56) References Cited

U.S. PATENT DOCUMENTS

| | | | |
|---|---|---|---|
| 5,671,178 A * | 9/1997 | Park et al. ............... | 365/185.22 |
| 5,996,041 A * | 11/1999 | Kim ............................ | 711/103 |
| 6,288,935 B1 | 9/2001 | Shibata | |
| 6,426,892 B2 | 7/2002 | Shibata | |
| 6,456,528 B1 | 9/2002 | Chen | |
| 6,496,412 B1 | 12/2002 | Shibata | |
| 6,522,580 B2 | 2/2003 | Chen et al. | |
| 6,671,204 B2 * | 12/2003 | Im ........................... | 365/185.12 |
| 6,717,857 B2 * | 4/2004 | Byeon et al. ............. | 365/185.21 |
| 6,807,095 B2 | 10/2004 | Chen et al. | |
| 6,813,184 B2 * | 11/2004 | Lee ........................ | 365/185.09 |
| 6,876,578 B2 | 4/2005 | Shibata et al. | |
| 6,925,004 B2 | 8/2005 | Shibata et al. | |

(Continued)

FOREIGN PATENT DOCUMENTS

JP    1020030011248 A    2/2003

(Continued)

OTHER PUBLICATIONS

Cho et al., "A Dual-Mode NAND Flash Memory: 1-Gb Multilevel and High-Performance 512-Mb Single-Level Modes" IEEE J. of Solid-State Circuits, vol. 36, No. 11, Nov. 2001.

(Continued)

Primary Examiner—Ly D Pham
(74) Attorney, Agent, or Firm—Harnes, Dickey & Pierce

(57) ABSTRACT

In one embodiment, the non-volatile memory device includes a plurality of normal memory cells, and at least one flag memory cell associated with one of the plurality of normal memory cells. A normal page buffer is configured to store data read from one of the plurality of normal memory cells. The normal page buffer includes a main latch storing the read data. A control circuit is configured to selectively change data stored in the main latch during a read operation based on a state of the flag memory cell.

11 Claims, 15 Drawing Sheets

U.S. PATENT DOCUMENTS

| | | | |
|---|---|---|---|
| 7,292,474 B2 * | 11/2007 | Iino et al. | 365/185.03 |
| 2002/0085419 A1 * | 7/2002 | Kwon et al. | 365/185.17 |
| 2005/0018488 A1 | 1/2005 | Kim et al. | |
| 2005/0207220 A1 * | 9/2005 | Takeuchi | 365/185.03 |
| 2005/0232011 A1 * | 10/2005 | Lee et al. | 365/185.12 |
| 2006/0181928 A1 | 8/2006 | Lee et al. | |
| 2007/0260817 A1 * | 11/2007 | Ha | 711/118 |
| 2008/0080260 A1 * | 4/2008 | Seong | 365/189.05 |

FOREIGN PATENT DOCUMENTS

| | | |
|---|---|---|
| JP | 1020040048344 A | 6/2004 |
| JP | 2004-192789 | 7/2004 |
| JP | 1020050007653 A | 1/2005 |
| JP | 2005-032431 | 2/2005 |

OTHER PUBLICATIONS

Takeuchi et al., "A Multipage Cell Architecture for High-Speed Programming Multilevel NAND Flash Memories" IEEE J. of Solid-State Circuits, vol. 33, No. 8, Aug. 1998.

Jung et al., "A 177-mm2 3.3-V Only 128-Mb Multilevel NAND Flash Memory for Mass Storage Applications" IEEE J. Of Solid-State Circuits, vol. 31, No. 11, Nov. 1996.

* cited by examiner

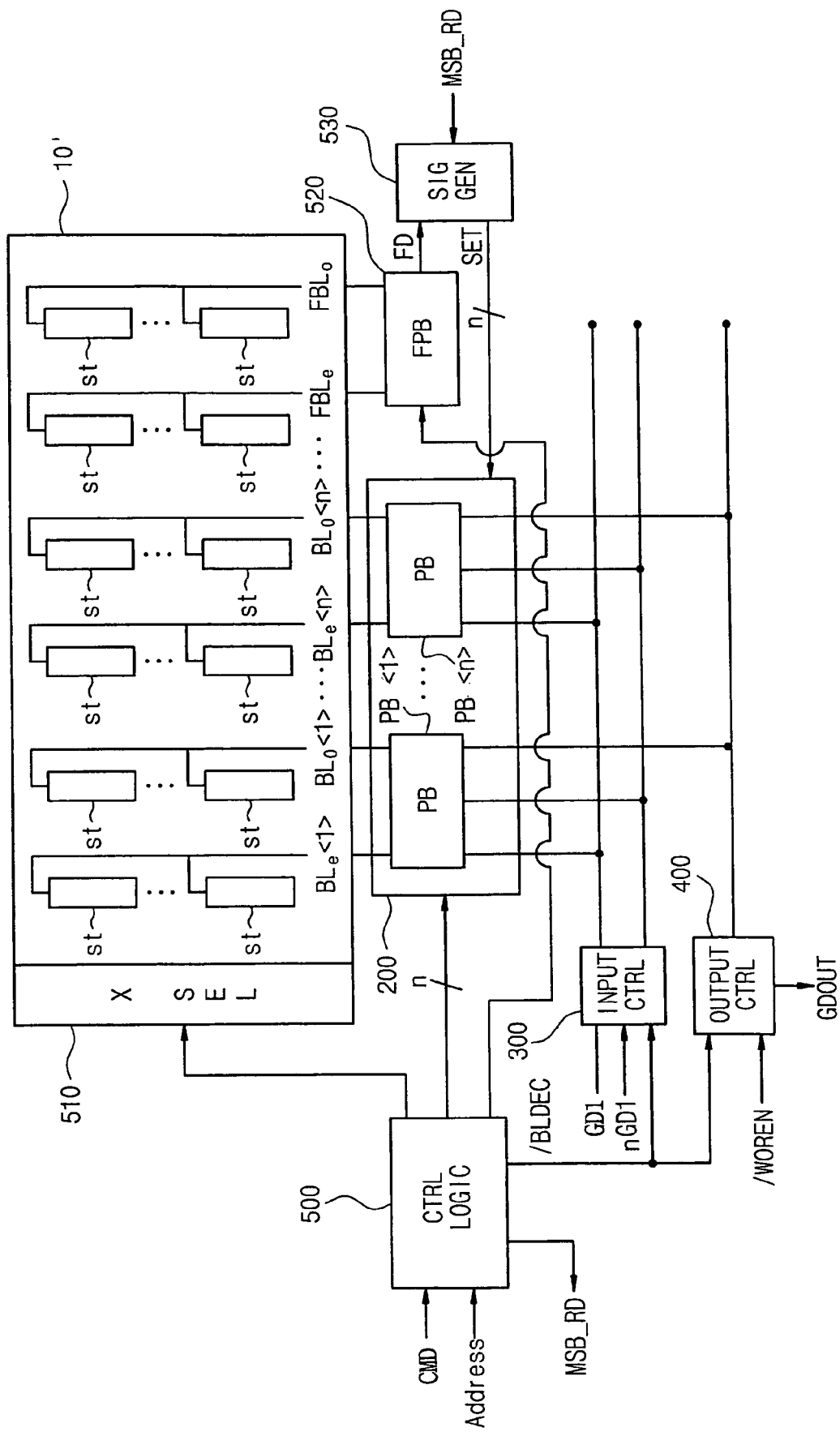

FIG. 9
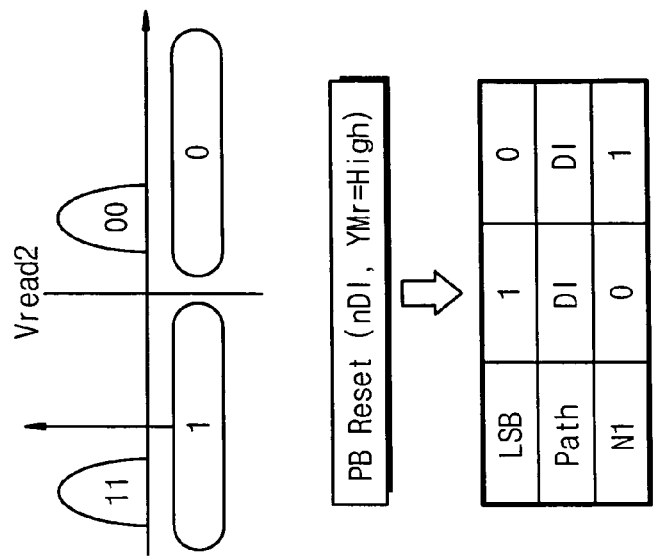
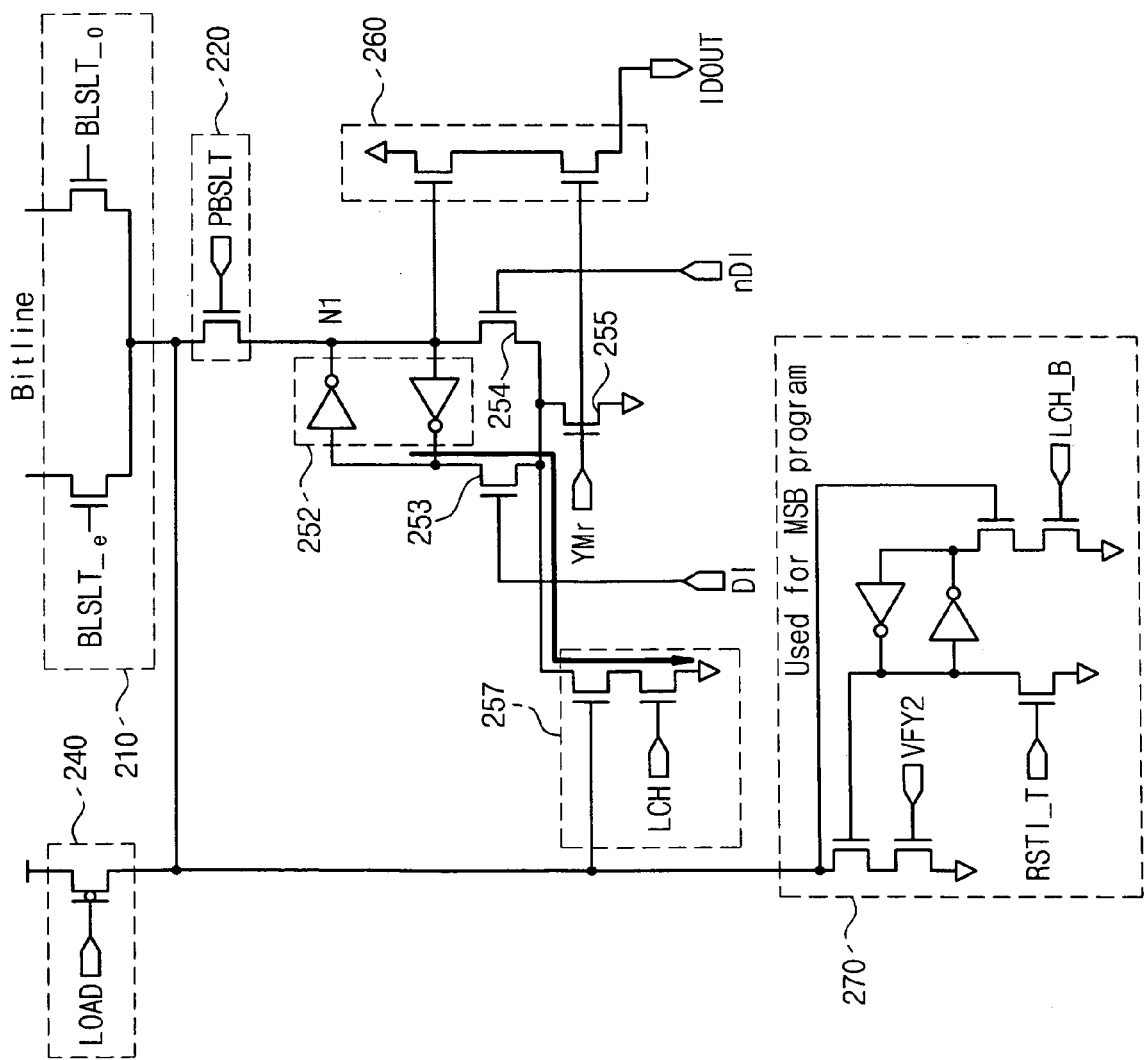

FIG. 10
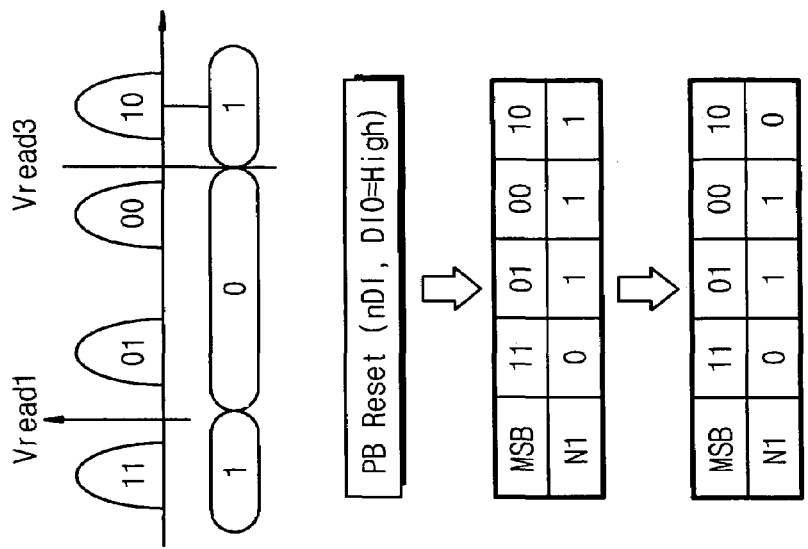
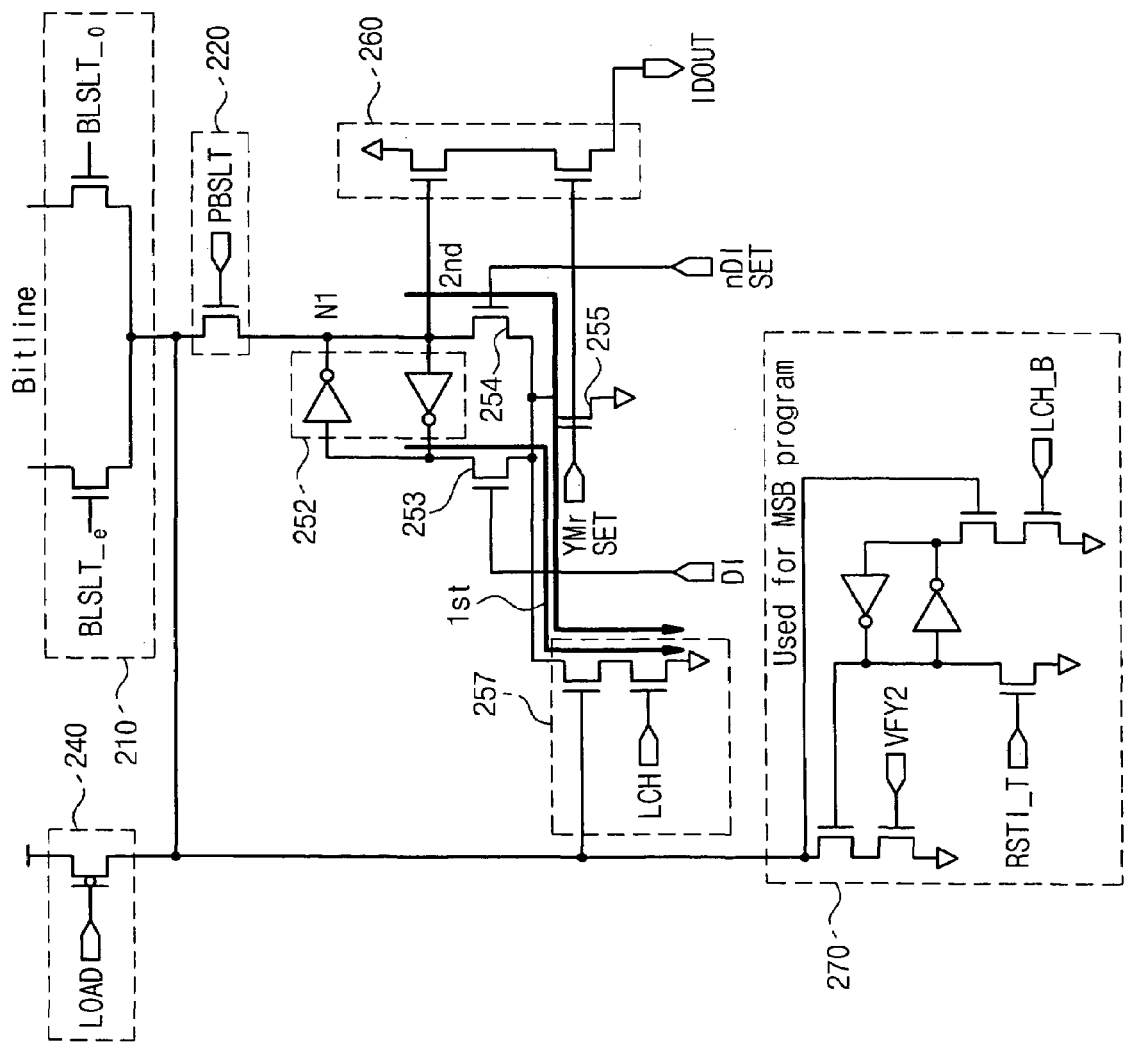

US 7,589,998 B2

NON-VOLATILE MEMORY DEVICE AND METHOD OF OPERATION THEREFOR

This U.S. non-provisional patent application claims priority under 35 U.S.C. § 119 of Korean Patent Application P2006-0007406 filed on Jan. 24, 2006, the entire contents of which are hereby incorporated by reference.

BACKGROUND OF THE INVENTION

1. Field of the Invention

Embodiments of the invention relate to nonvolatile semiconductor memory devices and related methods of operation.

2. Discussion of Related Art

Generally, read and write (programming/erase) operations for memory cells in a nonvolatile semiconductor memory device are carried out by controlling bit line voltages corresponding to selected memory cells. In order to properly drive bit lines voltages during a read or programming operation, contemporary nonvolatile semiconductor memory devices provide one or more page buffers to temporarily store the data to be written into or read from the memory cells.

FIG. 1 is a diagram illustrating a conventional nonvolatile semiconductor memory device, and FIG. 2 is a diagram illustrating a typical column gate YG and corresponding page buffer PBP in the memory device of FIG. 1. The conventional semiconductor memory device comprises a memory cell array 10 comprising a plurality of memory cells, connected to a plurality of "n" page buffers PBP. Each page buffer PBP is connected to a global data line GDL through a column gate YG.

Each page buffer PBP comprises a sense latch 150, precharge circuit 140, a bit line (BL) shielding block 120 and a BL bias circuit 110. In the conventional page buffer PBP, data to be written to a selected memory cell is loaded and latched in sense latch 150. Data stored in sense latch 150 is thus provided to bit line BLe or BLo through BL shielding block 120 and BL bias circuit 110. Thereafter, a programming operation may be performed relative to the selected memory cell. In similar fashion, data to be read from a selected memory cell is temporarily stored in sense latch 150. Data thus stored in sense latch 150 may be transferred to the global data line GDL in response to a column gate signal (not shown).

SUMMARY OF THE INVENTION

The principles of the present invention have application to various types of non-volatile memories, those currently existing and those contemplated for use in new technology. Implementations of the present invention, however, are described with respect to a flash electrically erasable and programmable read-only memory (EEPROM), wherein the storage elements are floating gates, as exemplary.

It is common in current commercial products for each floating gate storage element of a flash EEPROM array to store a single bit of data by operating in a binary mode, where two ranges of the floating gate transistors are defined as storage levels. Memory cells storing a single bit are often referred to as single level cells (SLCs).

In addition to shrinking the size of the memory arrays, the trend is to further increase the density of data storage of such memory arrays by storing more than one bit of data in each floating gate transistor. This is accomplished by defining more threshold levels as storage states for each floating gate transistor. For example, four such states may be defined to represent 2 bits of data per floating gate storage element. Each floating gate memory transistor has a certain total range (window) of threshold voltages in which it may practically be operated, and that range is divided into the number of states defined for it plus margins between the states to allow for them to be clearly differentiated from one another. These multiple state memory cells have multiple thresholds and are often referred to as multiple-level cells (MLCs).

These multiple-level memory cells present new challenges in memory circuit design. For example, writing two or more bits into such a multiple-level memory cell may require multiple, but related, operations. Similarly, reading two or more bits from an MLC may require multiple, but related read operations. Problems may also arise when the reading of a memory cell occurs before more significant bits have been written to the memory cell.

In one embodiment, the non-volatile memory device includes a plurality of normal memory cells, and at least one flag memory cell associated with one of the plurality of normal memory cells. A normal page buffer is configured to store data read from one of the plurality of normal memory cells. The normal page buffer includes a main latch storing the read data. A control circuit is configured to selectively change data stored in the main latch during a read operation based on a state of the flag memory cell.

In one embodiment, the plurality of normal memory cells have multiple states such that each state represents at least, a least significant bit and a next most significant bit.

In one embodiment, the read operation includes a least significant bit read operation and then a next most significant bit read operation, and the control circuit is configured to selectively change data stored in the first latch as a result of the next most significant bit read operation.

For example, in one embodiment, the control circuit is configured to change the data stored in the main latch if the flag memory cell is in an erased state. Here, the flag memory cell may be in an erased state if a next most significant bit write operation for the associated normal memory cell has not taken place, and the flag memory cell is in a non-erased state if a next most significant bit write operation for the associated normal memory cell has taken place.

A further embodiment of a non-volatile memory device, includes a plurality of normal memory cells and at least one flag memory cell associated with one of the plurality of normal memory cells. A normal page buffer is configured to store data for writing into one of the plurality of normal memory cells and is configured to store data read from one of the plurality of normal memory cells. The normal page buffer includes a main latch and a secondary latch. The main latch supplies write data to the plurality of normal memory cells during a write operation. A control circuit is configured to selectively set data stored in the main latch during a read operation based on a state of the flag memory cell.

Another embodiment of the non-volatile memory device includes a plurality of normal memory cells and at least one flag memory cell associated with one of the plurality of normal memory cells. A selector selectively outputs one of a data value read from the normal memory cell associated with the flag memory cell and a fixed data value. A control circuit is configured to control the selector based on a state of the flag memory cell.

In one embodiment, the plurality of normal memory cells have multiple states such that each state represents at least, a least significant bit and a next most significant bit.

In one embodiment, a read operation of a normal memory cell includes a least significant bit read operation and then a next most significant bit read operation. The control circuit is configured to control the selector to selectively output one of the data value read during the next most significant bit read operation and the fixed data value based on the state of the flag memory cell. For example, the control circuit is configured to control the selector to output the fixed data value if the flag memory cell is in an erased state during the next most significant bit read operation, and the flag memory cell is in an erased state if a next most significant bit write operation for the associated normal memory cell has not taken place.

The present invention is further related to a method of reading data from a normal memory cell.

In one embodiment, the method includes storing data read from one of a plurality of normal memory cells in a page buffer connected to the plurality of normal memory cells. The page buffer includes a first latch and a second latch, and the read data is stored in only the first latch. Data stored in the first latch is selectively changed based on a state of a flag memory cell associated with the read normal memory cell.

In another embodiment, the method of reading data from a normal memory cell includes receiving a data value read from the normal memory cell and a fixed data value at a selector. The selector is controlled to output one of the data value read from the normal memory cell and the fixed data value based on a state of a flag memory cell associated with the read normal memory cell.

BRIEF DESCRIPTION OF THE DRAWINGS

The present invention will become more fully understood from the detailed description given below and the accompanying drawings, wherein like elements are represented by like reference numerals, which are given by way of illustration only and thus are not limiting on the present invention and wherein:

FIG. 5 is a diagram illustrating a nonvolatile semiconductor memory device in accordance with an embodiment of the present invention;

FIG. 9 illustrates operation of a page buffer in FIG. 5 during a LSB read operation;

FIG. 10 illustrates the normal operation of a page buffer in FIG. 5 during a MSB read operation if corresponding flag data indicates the MSB has been written;

DESCRIPTION OF EXEMPLARY EMBODIMENTS

Example embodiments of the present invention will be described below in detail with reference to the accompanying drawings. The present invention may, however, be embodied in different forms and should not be construed as being limited to only the embodiments set forth herein.

Multiple Level Cell Principles

The principles of the present invention have application to various types of non-volatile memories, those currently existing and those contemplated for use in later developed technology. Implementations of the present invention, however, are described with respect to a flash electrically erasable and programmable read-only memory (EEPROM), wherein the storage elements are floating gates, as exemplary.

It is common in current commercial products for each floating gate storage element of a flash EEPROM array to store a single bit of data by operating in a binary mode, where two ranges of the floating gate transistors are defined as storage levels. Memory cells storing a single bit are often referred to as single level cells (SLCs).

In addition to shrinking the size of the memory arrays, the trend is to further increase the density of data storage of such memory arrays by storing more than one bit of data in each floating gate transistor. This is accomplished by defining more threshold levels as storage states for each floating gate transistor. For example, four such states may be defined to represent 2 bits of data per floating gate storage element. Each floating gate memory transistor has a certain total range (window) of threshold voltages in which it may practically be operated, and that range is divided into the number of states defined for it plus margins between the states to allow for them to be clearly differentiated from one another. These multiple state memory cells have multiple thresholds and are often referred to as multiple-level cells (MLCs).

Figure 1:
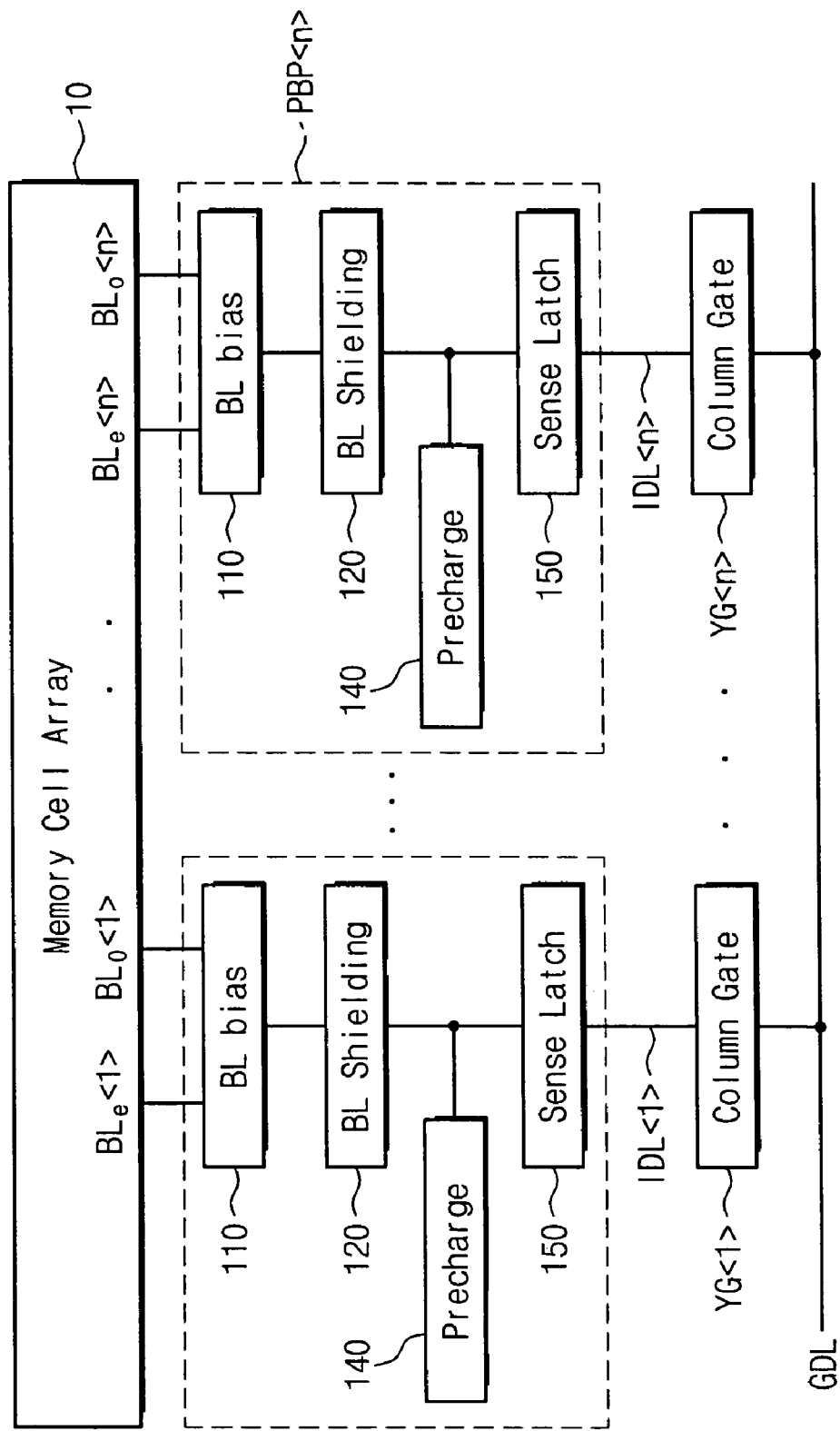
FIG. 1 is a diagram illustrating a conventional nonvolatile semiconductor memory device.
Figure 2:
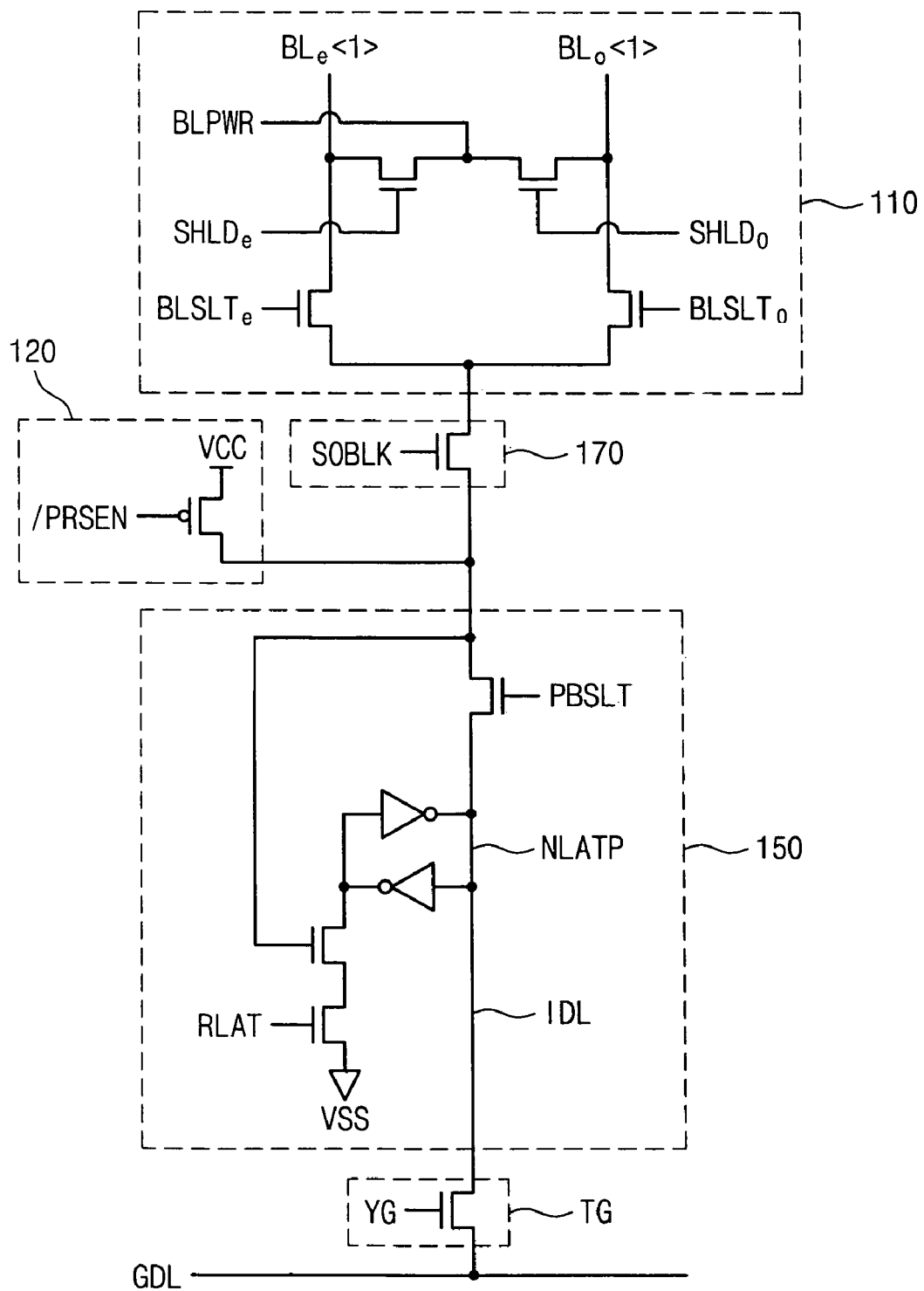
FIG. 2 is a diagram illustrating the a conventional column gate and page buffer structure of the conventional nonvolatile semiconductor memory device shown in FIG. 1.
Figure 3:
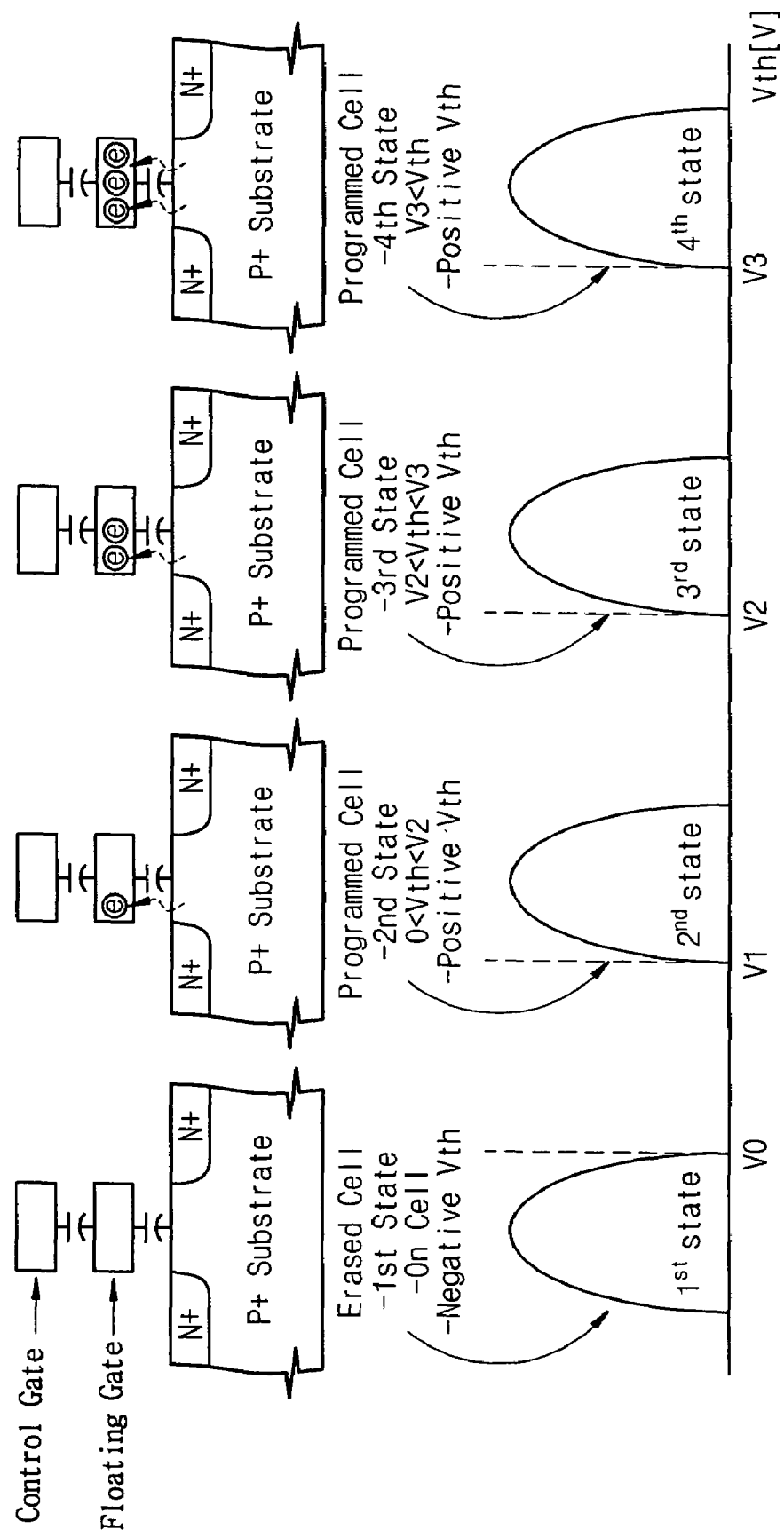
FIG. 3 illustrates the basic principal of a four state memory cell.

For the purposes of example only, MLCs having four states and capable of storing 2 bits of data will be described. However, it will be understood that the present invention is not limited to this MLC. FIG. 3 illustrates the basic principal of a four state memory cell. More particularly, FIG. 3 shows a four state NAND cell. As shown, an erased cell has a negative threshold voltage, and this corresponds to a first state. The second, third and fourth states of the cell each correspond to a programmed state of the cell with each successive state having a higher threshold voltage.

Another scheme for managing the correspondence between the MLC states and the bits associated therewith according to embodiments of the present invention will now be described with respect to FIGS. 4A-4B. In the management scheme of FIG. 4A, a least significant bit (LSB) of 1 results in no change to the first or erased cell, while a LSB of 0 results in programming the cell to the third state. Next, if the most significant bit (MSB) is 1, the cell remains in the first or erased state if the LSB is 1. For a LSB of 0, the cell is programmed to the fourth state if the MSB is 1. For a MSB of 0, the cell is programmed to the second state if the LSB is 1, and remains in the third state if the LSB is 0.

Figure 4A:
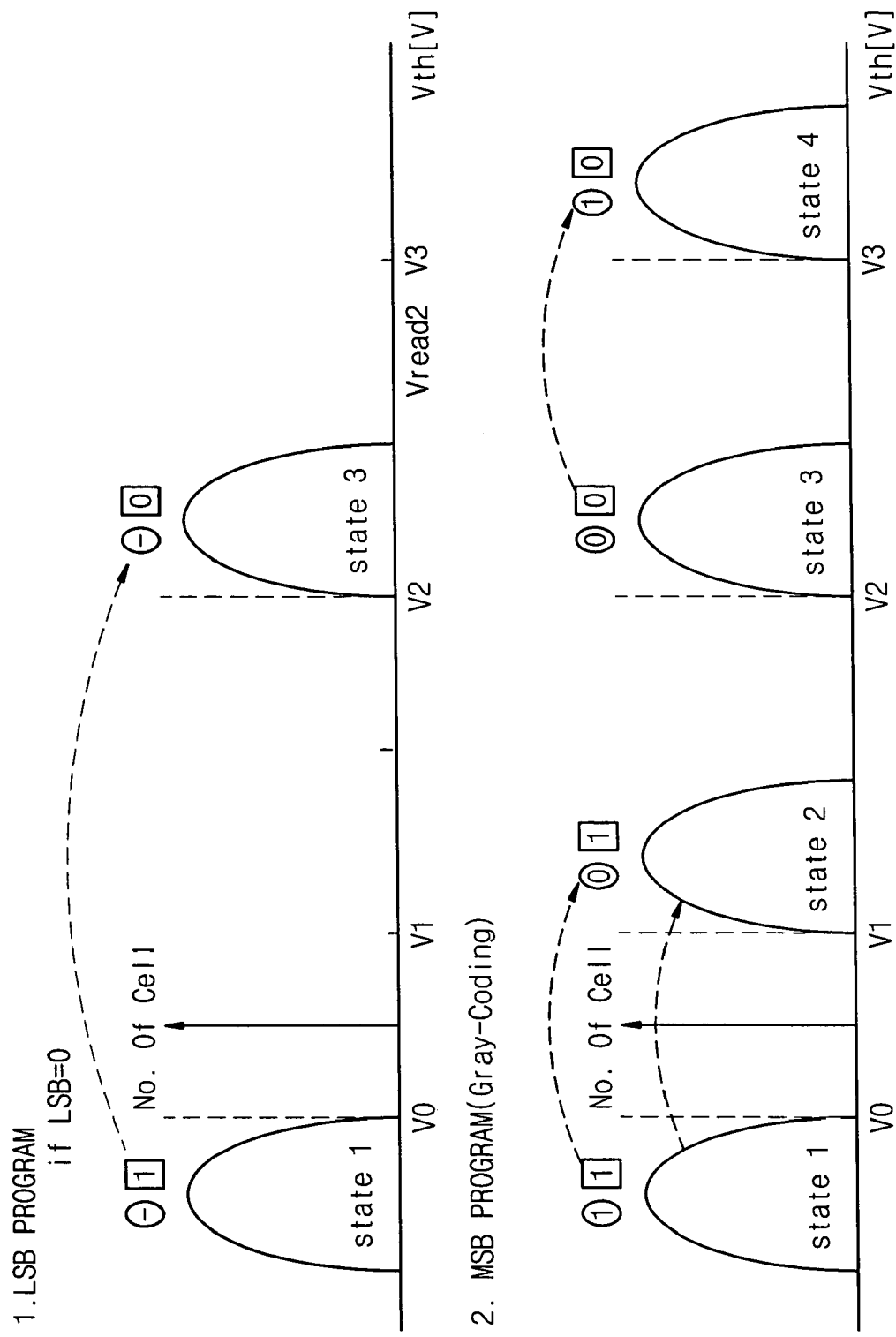
FIGS. 4A-4B illustrate another scheme for managing the correspondence between the MLC states and the bits associated therewith according to an embodiment of the present invention.
Figure 4B:
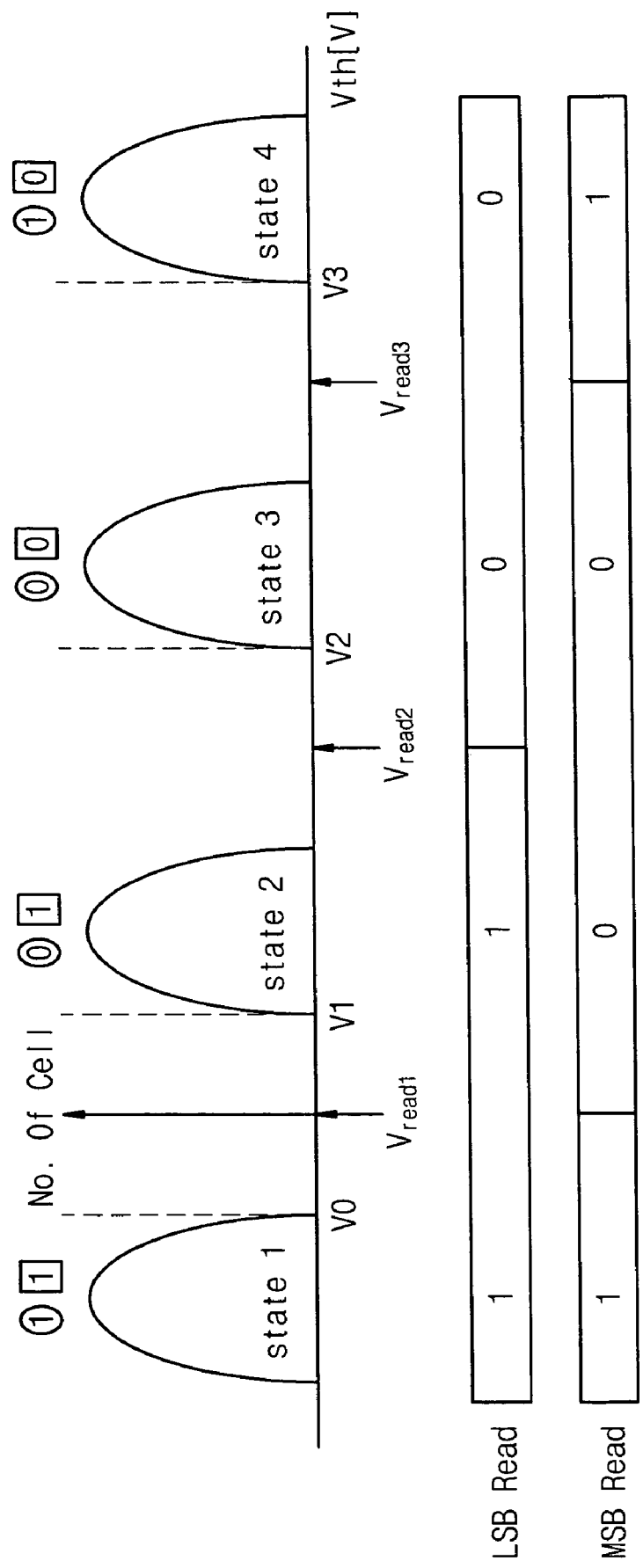

FIG. 4B shows the reading of the bits from the MLC written according to the scheme of FIG. 4A. As shown, a read voltage of Vread2 is applied to the cell to read the LSB.

However, to read the MSB, read voltages Vread1 and Vread3 are applied. Applying the Vread1 voltage discriminates between the first and second states, and applying the Vread3 voltage discriminates between the third and fourth states.

For the purposes of example, further description of the present invention will use the scheme of FIGS. 4A-4B.

First Embodiment

Non-Volatile Memory Device Structure

Figure 6:
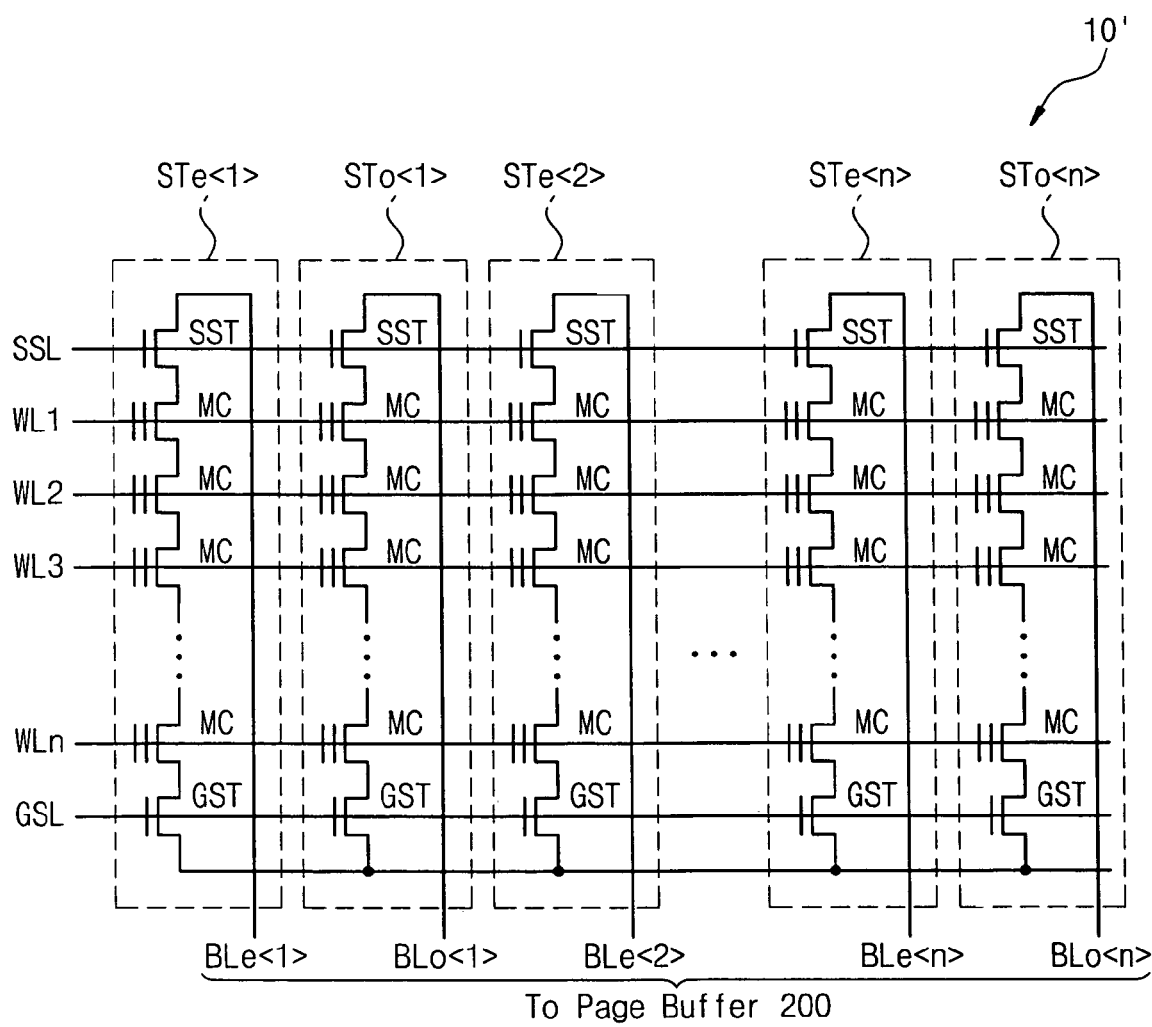
FIG. 6 is a diagram further illustrating a memory cell array shown in FIG. 5.

FIG. 5 illustrates a non-volatile memory device according to one embodiment of the present invention. As shown, the device includes a memory cell array 10'. The memory cell array 10' comprises a plurality of even and odd grouped bit lines (BLe<n:1> and BLo<n:1>), and corresponding strings St of memory cells for storing data received from bit lines (BLe<n:1> and BLo<n:1>) and outputting read data to the bit lines (BLe<n:1> and BLo<n:1>). The memory cell array 10' further includes even and odd flag bit lines FBLe and FBLo and a corresponding plurality of memory cells that will be referred to as flag memory cells. The flag bit lines and memory cells are the same as the normal bit lines (BLe<n:1> and BLo<n:1>) and memory cells. FIG. 6 illustrates a portion of the normal memory cells in the memory cell array 10' in some additional detail.

Referring now to FIG. 6, the memory cell array 10' comprises a plurality of cell strings (Ste<n:1> and STo<n:1>) each respectively connected to one of bit lines (BLe<n:1> and BLo<n:1>). Each cell string in the illustrated example is formed from a string selection transistor (SST) connected to its corresponding bit line, a ground selection transistor (GST) connected to a common source line (CSL), and a plurality of memory cells (MC) connected in series between the string selection transistor (SST) and the ground selection transistor (GST). As shown in FIG. 5, more than one string may be connected to a bit line (FIG. 6 shows only one string per bit line for clarity). Also, FIGS. 5 and 6 show that bit lines (BLe<n:1> and BLo<n:1>) are electrically connected to page buffer set 200.

Each one of the memory cells (MC) comprises a floating-gate transistor having a source, a drain, a floating gate and a control gate. The memory cells (MC) may be programmed using the Channel Hot Electron (CHE) effect or the Fowler-Nordheim (F-N) tunneling effect. These techniques are both conventionally understood. As described above, respective memory cells (MC) are at one of four multiple-level states representing different combinations of two bits, which correspond to a particular voltage level apparent on bit lines (BLe<n:1> and BLo<n:1>).

In the embodiment of the invention, two adjacent bit lines are configured to constitute a pair of bit lines. However, each bit line may be selected in relation to a unique column address. Therefore, in the illustrated embodiments described hereafter the two bit lines, (i.e., an even bit line and an odd bit line) will be referred to individually or collectively as a "bit line" without further differentiation.

During a read operation, the string selection transistor (SST), a ground selection transistor (GST), and all of plurality of memory cells (MC) except for the memory cell being read are turned on. A read voltage is applied to the word line, and therefore, the gate of the memory cell being read. If the read voltage is greater than the threshold voltage of the memory cell, then the memory cell is also turned on, and the voltage of the common source line is connected to the bit line. Namely, a current path will exist from the bit line to the CSL. In the example embodiments of the present invention described herein, the common source line is assumed to supply a ground voltage VSS. However, it will be appreciated that other than the ground voltage may be supplied depending on the design of the memory device. Also, if the read voltage is less than the threshold voltage of the memory cell, then the memory cell does not turn on. Accordingly, no current path between the bit line and the CSL is created.

FIG. 5 further shows that in addition to the normal memory cells connected to the normal bit lines (BLe<n:1> and BLo<n:1>), the memory cell array 10' also includes flag memory cells connected to flag bit lines FBLe and FBLo. The structures of the flag memory cells and flag bit lines FBLe and FBLo are the same as the normal memory cells and bit lines. The terms "flag" and "normal" have been used merely to distinguish between how the memory cells are used. The normal memory cells and bit lines are used to read and write data. Each flag memory cell lies in a row of normal memory cells, and indicates whether the second significant bit (e.g., the most significant bit in the scheme of FIGS. 4A-4B) has been written. For example, if the flag memory cell stores a logic "0", then the corresponding row of normal memory cells has not undergone writing of the most significant bit. If the flag memory cell stores a logic "1", then the corresponding row of normal memory cells has undergone writing of the most significant bit. The writing of the flag memory cells and use of the data stored therein will be described in greater detail below.

Also, it will be appreciated that the number of flag cells corresponding to a row of normal memory cells depends on the number of bits that one memory cell may represent. More specifically, a flag memory cell may be provided for each bit in excess of one to indicate whether that corresponding bit has been written or not.

Returning to FIG. 5, the memory device includes a row selector 510, page buffer set 200, flag page buffer 520, signal generator 530, input data controller 300, output controller 400, and control logic 500. The control logic 500 receives command and address information (e.g., from a host system), and generates control signals to control the operation of the row selector 510, the page buffer set 200, the flag buffer 520, the signal generator 530, the input data controller 300, and the output controller 400. The commands may be at least one of a read command and a write command. The address information indicates an address of at least one memory cell in the memory cell array 10'. In particular, the control logic 500 decodes the address information into a row address and a column address.

Based on the command and the row address, the control logic 500 controls the row selector 510 to assert the appropriate word lines WLi, string selection transistor (SST) and a ground selection transistor (GST) to select a row of memory cells MC for a read or write operation.

Figure 7:
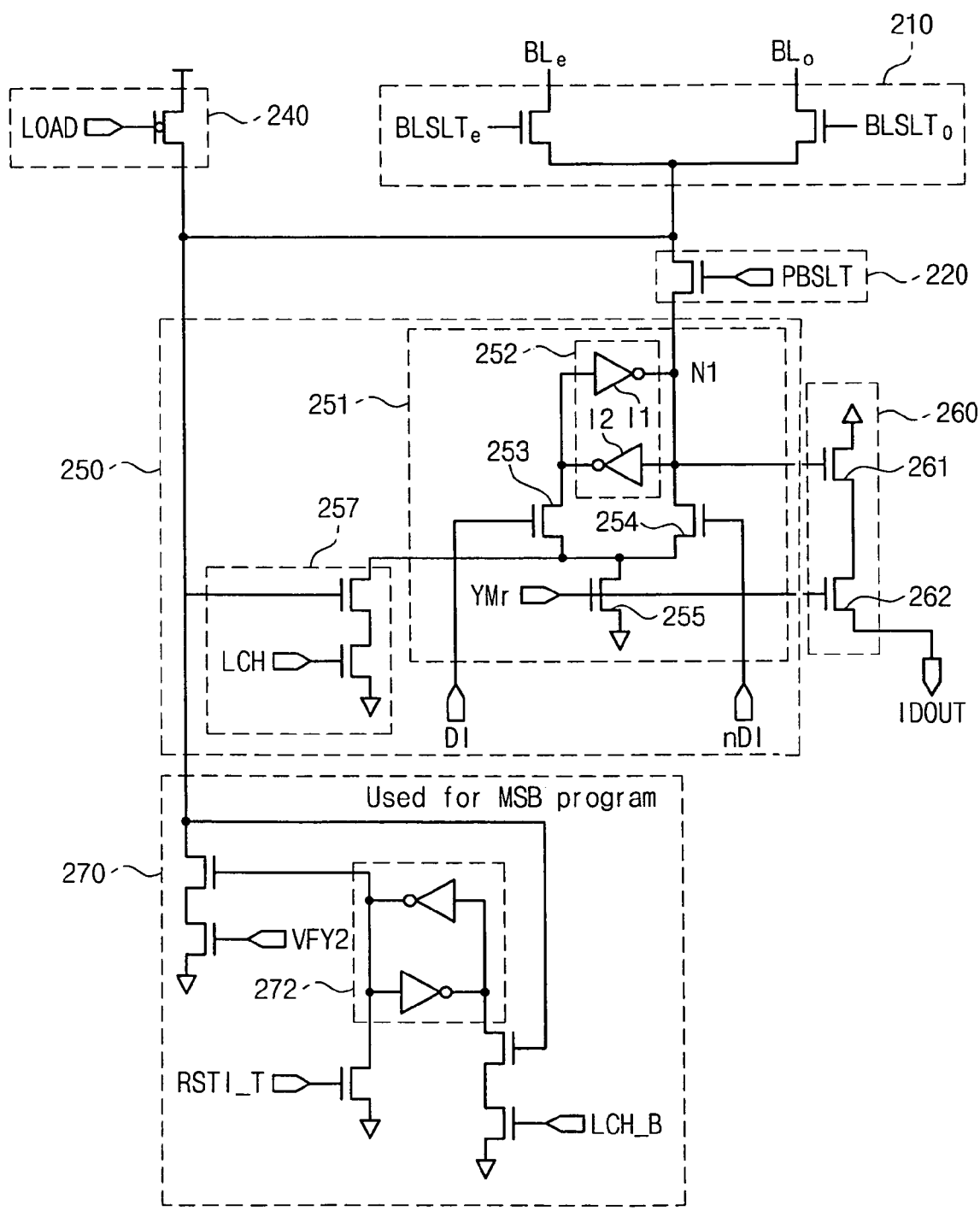
FIG. 7 is a circuit diagram further illustrating a page buffer shown in FIG. 5.

Based on the command and the column address, the control logic 500 generates the control signals supplied to the gates of the transistors in the page buffer PGN as shown in FIG. 7 and described in detail below. In this manner, the control logic 500 selects a page buffer PB in the page buffer set 200. This will be described in more detail below. Based on the command and address information, the control logic 500 also generates the same control signals to control operation of the flag page buffer 520. This will also be discussed in detail below.

Furthermore, based on whether data is being written into or read from the memory cell array 10', the control logic 500 generates signals /BLDEC and /WOREN (discussed below) for controlling the operation of the input data controller 300 and the output controller 400. Again, this will be described in more detail below.

The control logic 500 still further generates a most significant bit read signal MSB_RD indicating whether the read operation for the most significant bit is taking place. The signal generator 530 uses the data read from the flag memory cells and the most significant bit read signal MSB_RD to generate set signals SET <1:n> to selectively control the individual operation of the page buffers PB in the page buffer set 200. This too will be described in greater detail below.

First, however, the structure and operation of the page buffers PB in the page buffer set 200 will be described. Returning to FIG. 7, page buffer set 200 comprises a plurality of page buffers (PB<n:1>) disposed with respect to corresponding bit lines (BLe<n:1> and BLo<n:1>). Thus, in one embodiment, page buffers (PB<n:1>) are placed in different connecting positions with respect to memory array 10', but each has essentially the same circuit structure. Accordingly, individual page buffers within the plurality of page buffers will not be distinguished further on in this description. Rather, each will merely be indicated by use of the reference numeral (PB) without ordering suffixes such as "n:1". Furthermore, the flag page buffer FPB may have the same structure and operation as the normal page buffers PB, and the description below equally applies to the flag page buffer FPB.

Page Buffer Structure

FIG. 7 is a circuit diagram illustrating a page buffer (PB) according to an embodiment in greater detail. The page buffer (PB) comprises a bit line (BL) shielding block 210, a bit line (BL) blocking block 220, a precharging block 240, a main latch block 250, an output driver 260, and a secondary latch block 270.

The BL shielding block 210 selectively connects and disconnects the two bit lines (BLe and BLo) from the page buffer PB. The BL selecting block 220 controls whether the bit lines (BLe and BLo) are connected with a sensing node N1 apparent in main latch block 250. The precharging block 240 precharges the sensing node N1 to a power source voltage (VCC) in response to a sensing precharge signal (LOAD).

The exemplary circuit structures and operations of BL shielding block 210, BL selection block 220, and precharging block 240 are well-known and may be readily understood by those skilled in the art with reference to FIG. 7. Therefore, these circuit blocks will not be described in any further detail for the sake of brevity.

The main latch block 250 comprises a main latch 252 for latching data read from the bit lines, and the read data appears at the sensing node N1 as main latch data (MLD). The main latch data is output by the output driver 260. The operation and structure of the main latch block 250 will be described in greater detail below.

The output driver 260 drives an internal output line (IDOUT) in a unidirectional activation mode of operation in relation to the voltage (i.e., the logic) level of the main latch data (MLD). In other words, the internal output line (IDOUT) is driven to an output driving voltage (i.e., ground voltage VSS in the illustrated embodiment) in response to a main latch data (MLD) having a logically high value.

Data driven onto the internal output line (IDOUT) is ultimately transferred to an external device by way of output controller 400. (See, FIG. 5). In more detail, each internal output line (IDOUT) may have data driven onto by corresponding main latch data (MLD) within each one of the plurality of page buffers. Therefore, when one main latch data (MLD) within the plurality of page buffers has a logically high value, its corresponding internal output line (IDOUT), which is connected to the global output line (GDOUT), may be driven at a voltage level consistent with the output driving voltage even when the remaining main latch data (MLD) values for the remaining page buffers all have logically low values.

The secondary latch block 270 comprises secondary latch 272, and is used during programming of the MSB.

The present invention is related to operation of the page buffer PB during a read operation. Accordingly, a detailed description of the readily apparent page buffer structure and operation for the erase and programming operations will not be described in detail for the sake of brevity. Accordingly, the structure and operation of the secondary latch block 270 will not be described.

Instead, the main latch block 250 and output driver 260 will be described in some additional detail. In particular the structure of the main latch block 250 and output driver will be explained first. The main latch block 250 comprises sensing node N1, a main latch circuit 251 (including main latch 252), and a sense responding circuit 257. The sensing node N1 holds (or develops) a voltage corresponding to data received from the bit line (BLe or BLo), being electrically connected to the bit line (BLe or BLo) through BL selecting block 220. During a read operation, the sense responding circuit 257 selectively applies a ground voltage VSS to the main latch circuit 251.

In the main latch circuit 251, first and second inverters I1 and I2 are connected in the well-known manner to form a latch. Namely, the output of the second inverter I2 is connected to the input of the first inverter I1, and the output of the first inverter I1 is connected to the input of the second inverter I2. The sensing node N1 is the output of the first inverter I1.

A first control transistor 253 is connected between the output of the second inverter I2 and the sense responding circuit 257. A second control transistor 254 is connected between the input of the second inverter I2 and the sense responding circuit 257. As will be described in detail below, during a read operation, the first and second control transistors 253 and 254 are controlled by first and second control signals DI and nDI output from the control logic 500 to develop the voltage corresponding to data received from the bit line (BLe or BLo) at the sensing node N1.

A selection transistor 255 is connected between the sense responding circuit 257 and ground VSS. Operation of the selection transistor 255 is controlled by a main-latch selection address signal (YMr) output from the control logic 500. The selection address signal YMr is asserted, for example driven to logic high, to select the page buffer PB.

The output driver 260 connects the internal output line (IDOUT) to communicate the main latch data (MLD) during a read operation. In the illustrated example, output driver 260 comprises a first output driving transistor 261 and a second output driving transistor 263. First output driving transistor 261 is gated by the main latch data (MLD). Namely, first output driving transistor 261 is turned ON when the main latch data (MLD) is set to a logical high level. Second output driving transistor 263 is gated by the main-latch selection address signal (YMr), thereby driving the internal output line (IDOUT) to the ground voltage (VSS).

Thus, in the illustrated embodiment, when the main latch data (MLD) is set to a logical high, the internal output line (IDOUT) is driven to ground voltage (VSS) in response to the logical high level transition of the main-latch address selection signal (YMr).

Input Data Controller and Output Controller

Returning now to FIG. 5, the memory device further comprises input data controller 300 and output controller 400. Input data controller 300 is enabled in response to a block decoding signal (/BLDEC) having a logical low value. Here, the block decoding signal (/BLDEC) is provided to specifically designate the internal output line (IDOUT). In other words, the block decoding signal (/BLDEC) is an address signal to select the page buffers (e.g., page buffer set 200) connected to a single internal output line (IDOUT).

Input data controller 300 activates one of the first and second internal input lines (IDI and nIDI) in correspondence with data on the first and second global input lines (GDI and nGDI). Data on the first and second input lines (IDI and nIDI) is provided to cache latch block 270. Here, the data on the first and second global input lines (GDI and nGDI) correspond to the input data, however, being logically complementary in the illustrated example.

Therefore, either the first internal input line (IDI) or the second internal input line (nIDI) is activated in accordance with the input data. As a result, data corresponding to the input data is provided to secondary latch block 270.

Output controller 400 electrically connects the internal output line (IDOUT) to the global output line (GDOUT) in response to a wired-ORing signal (/WOREN) and a block decoding signal (/BLDEC). Here, the wired-ORing signal (/WOREN) is activated at a logical low value in a wired-OR operation that simultaneously verifies data from all page buffers connected to a single internal output line (IDOUT). The block decoding signal (/BLDEC) designates the internal output line (IDOUT).

Therefore, output controller 400 electrically connects the internal output line (IDOUT) to the global output line (GDOUT) during the wired-OR operation mode when page buffer set 200 is selected by the block decoding signal (/BLDEC).

Figure 8:
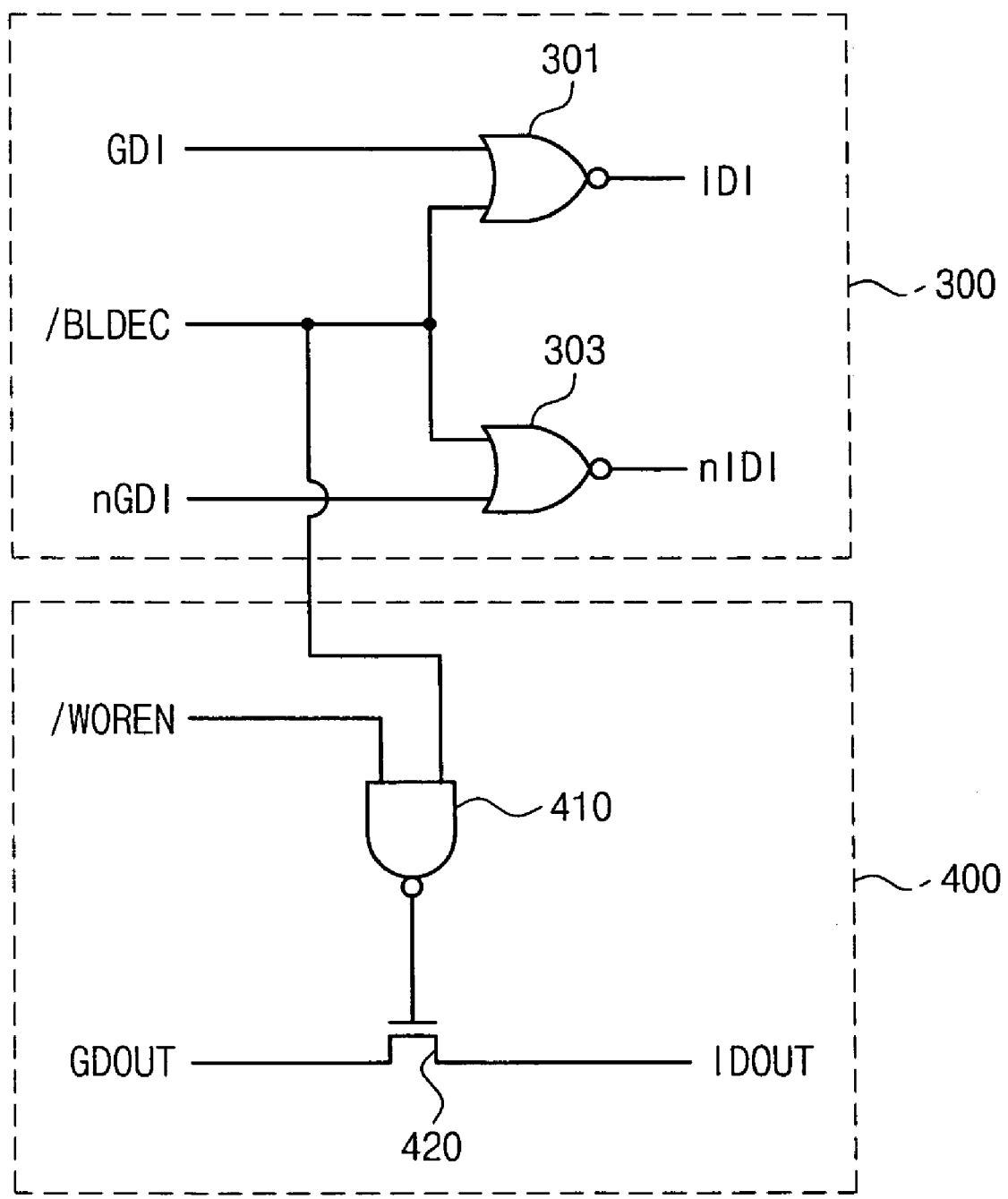
FIG. 8 is a diagram further illustrating an input data controller and an output controller shown in FIG. 5.

FIG. 8 is a diagram further illustrating the input data controller 300 and the output controller 400 shown in FIG. 7. Referring to FIG. 10, input data controller 300 comprises first and second decoder-logic gates 301 and 302.

First decoder-logic gate 301, being enabled by the block decoding signal (/BLDEC), inverts data from the first global input line (GDI) and provides the inverted data to the first internal input line (IDI). Second decoder-logic gate 303, being enabled by the block decoding signal (/BLDEC), inverts data from the second global input line (nGDI) and provides the inverted data to the second internal input line (nIDI).

Output controller 400 comprises a switching logic gate 410 and a switching transistor 420. Switching logic gate 410 logically multiplies the block decoding signal (/BLDEC) by the wired-ORing signal (/WOREN) and thereby generates a switch control signal (SW) to regulate the switching transistor 420.

Switching transistor 420 provides data from the internal output line (IDOUT) to the global output line (GDOUT) when the block decoding signal (/BLDEC) or the wired-ORing signal is activated at a logical low value.

Write/Program Operation

The write or program operation of MLC memory cells is well-known in the art and readily apparent from the detail circuit diagrams presented. Accordingly, a detailed description thereof will not be provided for the sake of brevity.

However, differences from conventional write/program operation will be described next.

In the non-volatile semiconductor memory device of FIG. 5, after writing the MSB or concurrently with the writing of the MSB, the control logic 500 also writes or programs the flag memory cell corresponding to the normal memory cell(s) that have had the MSB written. Accordingly, the programmed or written state of the flag memory cell indicates that the corresponding normal memory cells has had the MSB written, while the erased state of the flag memory cell indicates the corresponding normal memory cells have not have the MSB written. Also, if normal memory cells are erased, then the control logic 500 also erases the associated flag memory cells.

Read Operation

As discussed above, the present invention is directed to reading data from a non-volatile semiconductor memory device. The read operation according to embodiments of the present invention will be referred to FIGS. 9-12. This discussion will focus on a single memory cell being read and the associated page buffer PB. Also, for the sake of brevity, well-known aspects of the read operation will not be described in great detail.

Referring to FIG. 9, a read operation for reading the LSB of an MLC memory cell will be described. As shown, the control logic 500 resets the page buffer PB by applying a high voltage as the second control signal nDI and the main-latch selection address signal YMr. This turns on the second control transistor 254 and the selection transistor 255 such that the sensing node N1 is connected to ground VSS. As a result, the main latch 252 stores a logic low at the sensing node N1.

Next, the control logic 500 applies control signals to the memory array 10' to read data from the MLC memory cell as discussed in detail above. In particular, the read voltage Vread2 is applied to the word line of the MLC memory cell, and the BLSLT_e, BLSLT_o and PBSLT control signals are applied to the BL shielding block 210 and the BL blocking block 220 such that the sensing node N1 is connected to the bit lines of the MLC memory cell. The control logic 500 further applies the LOAD signal to the precharging block 240, the LCH control signal to the sense responding circuit 257 and the first control signal DI to the first control transistor 253 such that a current path from the main latch 252 to ground VSS is formed. This allows the data stored by the main latch 252 to change based on the state of the MLC memory cell. Namely, if the LSB stored by the MLC is a 0 (e.g., MLC states 2, 3 and 4 in FIGS. 4A-4B), then the MLC memory cell does not turn on because Vread2 is less than the threshold voltage of the MLC memory cell. However, by pulling the input to the first inverter I1 to ground, this causes the sensing node N1 to become logic high. By contrast, when the LSB stored by the MLC is 1 (e.g., MLC state 1 in FIGS. 4A-4B), then the MLC memory cell does turn on because Vread2 is greater than the threshold voltage of the MLC memory cell, and this drives the sensing node N1 to a logic low voltage (a logic 0).

The selection address signal YMr is asserted, and IDOUT is pulled to ground or not based on the sensing node N1. If the sensing node N1 of the main latch 252 stores a logic high voltage (e.g., a logic 1), then the ground voltage VSS is output as IDOUT. If the sensing node N1 of the main latch 252 stores a logic low voltage (e.g., a logic 0), then failure of IDOUT to go to a logic low voltage signifies a logic high output.

Figure 11:
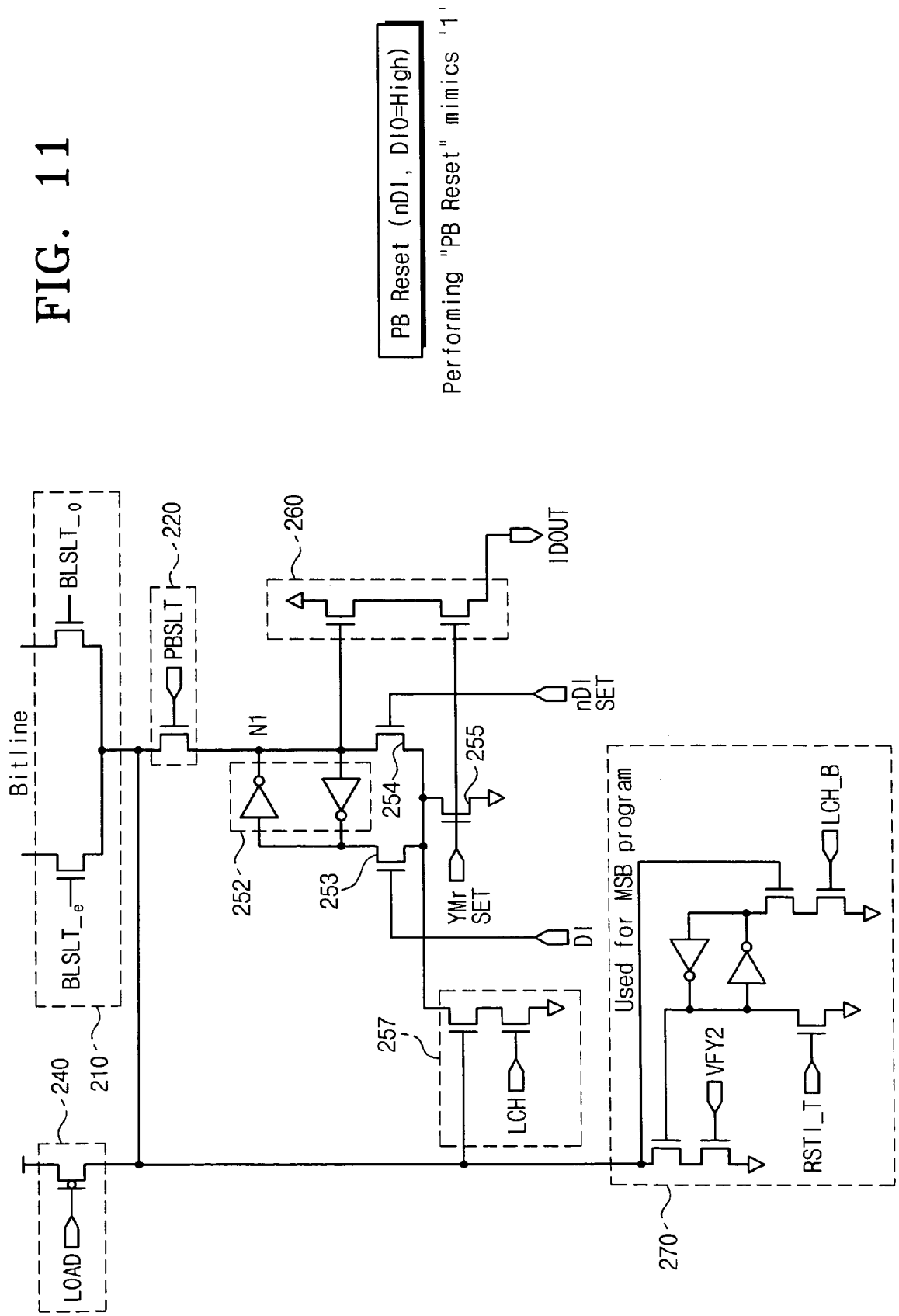
FIG. 11 illustrates the operation of a page buffer in FIG. 5 during a MSB read operation if corresponding flag data indicates the MSB has not been written.

Next, the MSB read operation will be described. Here, the control logic 500 generates control signals such that the data stored by the flag memory cell associated with the MLC memory cell is read. The read flag data is output by the flag page buffer FPB to the signal generator 530. The control logic 500 also enables operation of the signal generator 530 by sending the MSB_RD signal indicating that the MSB is being read. When enabled, the signal generator 530 generates a SET signal based on the state of the flag data. If the flag data indicates that the MSB of the MLC has been written, the SET signal for the page buffer PB is a logic low voltage such that the operation of the page buffer PB is not affected. As shown in FIGS. 10 and 11 below, the SET signal is supplied to the gates of the second control transistor 254 and the selection transistor 255. Accordingly, a logic low voltage SET signal does not turn these transistors on.

FIG. 10 illustrates the normal operation of the page buffer PB in reading the MSB of a MLC memory cell. As shown, after resetting the page buffer PB as described above with respect to reading the LSB, reading the MSB is a two stage process. The first stage is the same as reading the LSB except that the Vread1 voltage is applied to the word line of the MLC memory cell. Namely, the control logic 500 applies the Vread1 voltage to the word line of the MLC memory cell, and applies the LOAD signal to the precharging block 240, the LCH control signal to the sense responding circuit 257 and the first control signal DI to the first control transistor 253 such that a current path from the main latch 252 to ground VSS is formed. For MLC states 2, 3 and 4, the threshold voltage is higher than the Vread1 voltage, and as described above with respect to reading the LSB, the sensing node N1 stores a logic high voltage. For MLC state 1, the threshold voltage is less than the Vread1 voltage, and as described above with respect to reading the LSB, the sensing node stores a logic low voltage.

In the second stage, the control logic 500 applies the Vread3 voltage to the word line of the MLC memory cell, and applies the LOAD signal to the precharging block 240, the LCH control signal to the sense responding circuit 257 and the second control signal nDI to the second control transistor 254 such that a current path from the main latch 252 to ground VSS is formed though the second control transistor 254 and not the first control transistor 253. For MLC state 4, the threshold voltage is higher than the Vread3 voltage and a current path to ground is formed such that the sensing node N1 changes to a logic low voltage. For MLC states 1, 2 and 3, the threshold voltage is less than the Vread3 voltage, and no current path is formed such that the state of the sensing node N1 does not change.

The selection address signal YMr is then asserted to cause the output driver 260 to read out the MSB as discussed above with respect to reading the LSB.

Returning to the discussion of the flag cell data and operation of the signal generator 530, if the flag cell data read from the flag cell corresponding the MLC memory cell indicates that the MSB has not been written in the MLC memory cell, then the signal generator 530 generates a logic high SET signal. The SET signal is applied to the second control transistor 254 and the selection transistor 255 as shown in FIG. 11. As a result, this operation is the same as the reset operation which causes a logic low voltage to be stored by the sensing node N1. And, as described above, a logic low voltage at the sensing node N1 results in the output driver 260 outputting a logic high voltage.

Accordingly, regardless of the voltages applied to the word line of the MLC memory cell and the control signals applied to the page buffer PB by the control logic 500, the page buffer PB outputs a logic 1.

As will be appreciated, the function of the signal generator 530 may be incorporated into the control logic 530. Accordingly, instead of generating the SET signals, the control logic 530 may directly generate the second control signal nDI and the selection signal YMr to reset the page buffer PB.

Figure 12:
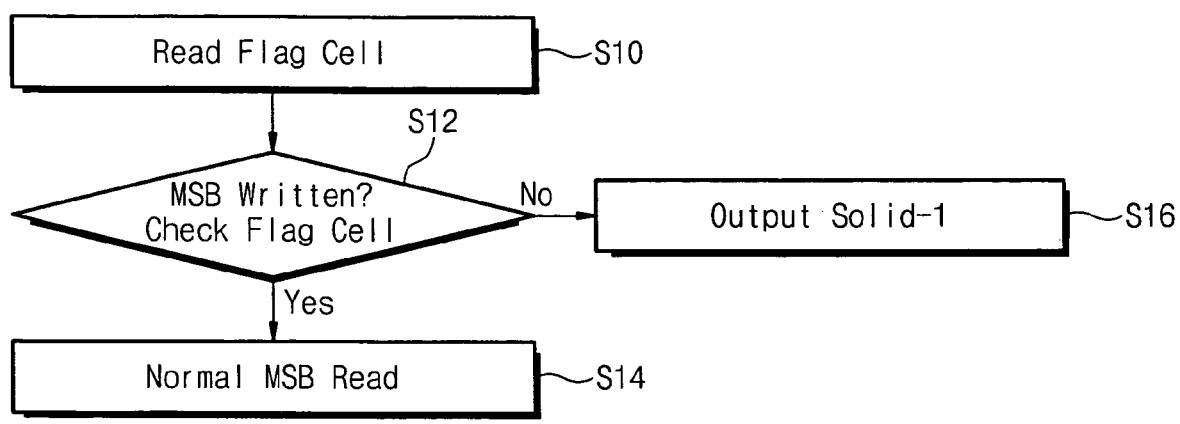
FIG. 12 illustrates a flow chart of the method of reading a MSB in the nonvolatile semiconductor memory device of FIG. 5 according to an embodiment of the present invention.

FIG. 12 illustrates the method of reading the MSB according to an embodiment of the present invention. As shown, in step S10, the flag cell corresponding to the MLC memory cell to undergo a MSB read operation is read. In step S12, a determination is made as to whether the flag cell data indicates that the MSB has been written in the MLC memory cell or not. If so, then a normal MSB read operation as discussed above with respect to FIG. 10 is undertaken in step S14. If no in step S12, then the operation to force the page buffer PB to output a logic 1 is undertaken in step S16.

Second Embodiment

Non-Volatile Memory Device Structure

Figure 13:
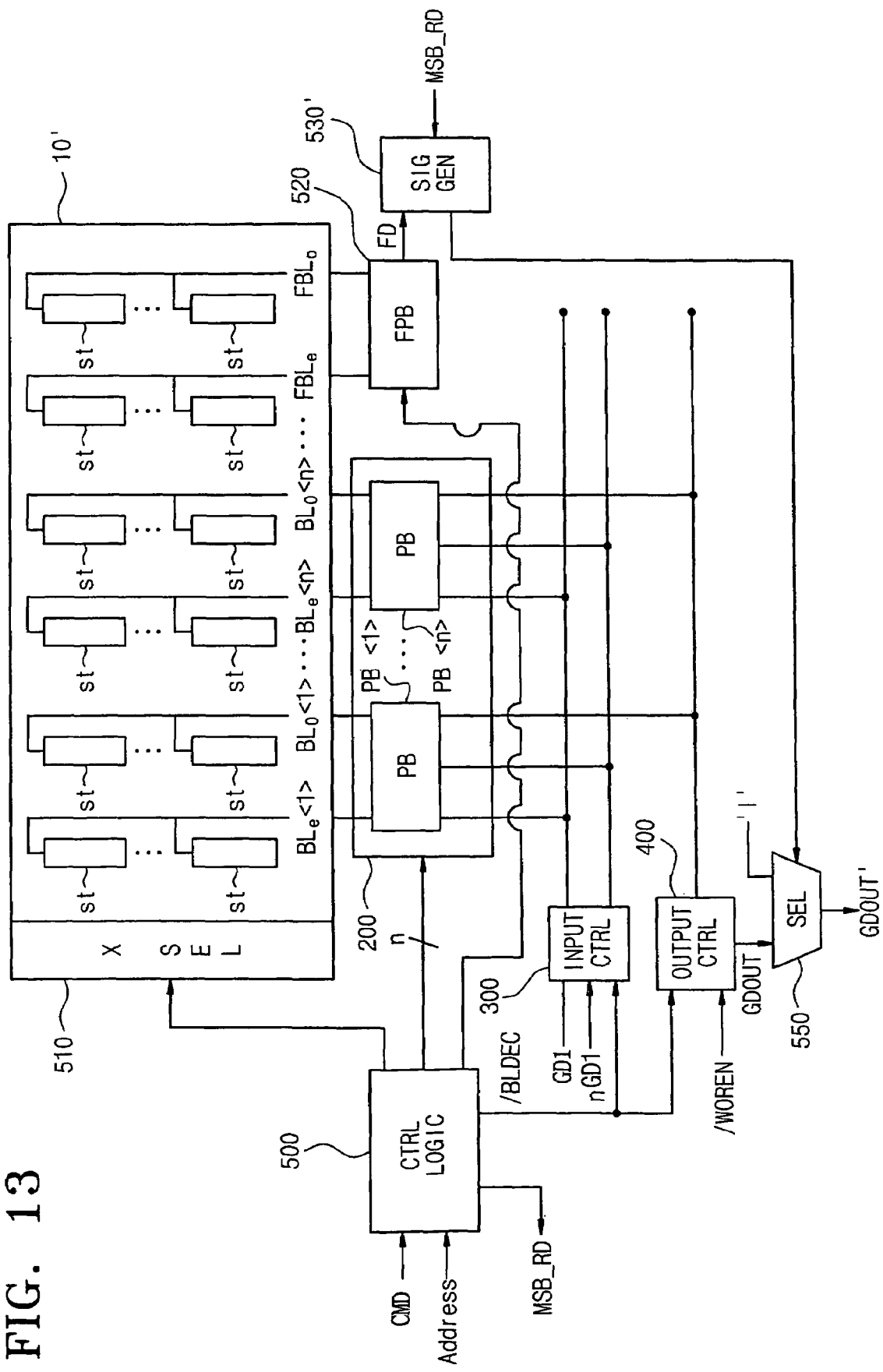
FIG. 13 is a diagram illustrating a nonvolatile semiconductor memory device in accordance with another embodiment of the present invention.

FIG. 13 illustrates a non-volatile memory device according to another embodiment of the present invention. As shown, this embodiment is the same as the embodiment of FIG. 5 except that signal generator 530 has been replaced by a signal generator 530' and a selector 550 has been added. For the sake of brevity, only the structural and operational differences from the embodiment of FIG. 5 will be described.

The signal generator 530', unlike the signal generator 503 of FIG. 5, does not send SET signals to the page buffers PB. Instead, a selection signal is sent to the selector 550. As shown, the selector 550 receives the output GDOUT from the output controller 400 and receives a logic 1. The selector 550 selects one of these inputs for output as the output data GDOUT'. If the MSB bit read signal MSB_RD indicates that a MSB is not being read, the signal generator 530' generates a selection signal such that the selector 550 outputs the output GDOUT from the output controller 400. Also, if the MSB read signal MSB_RD indicates the MSB is being read and the flag data associated with the read MLC memory cell indicates the MSB was written, the signal generator 530' generates a selection signal such that the selector 550 outputs the output GDOUT from the output controller 400. However, if the MSB read signal MSB_RD indicates the MSB is being read and the flag data associated with the read MLC memory cell indicates the MSB was not written, the signal generator 530' generates a selection signal such that the selector 550 outputs logic 1.

Accordingly, while the embodiment of FIG. 13 is illustrated using the same page buffers PB and flag page buffer FPB as in FIG. 5, conventional and/or well-known page buffers could be used instead in the embodiment of FIG. 13.

Figure 14:
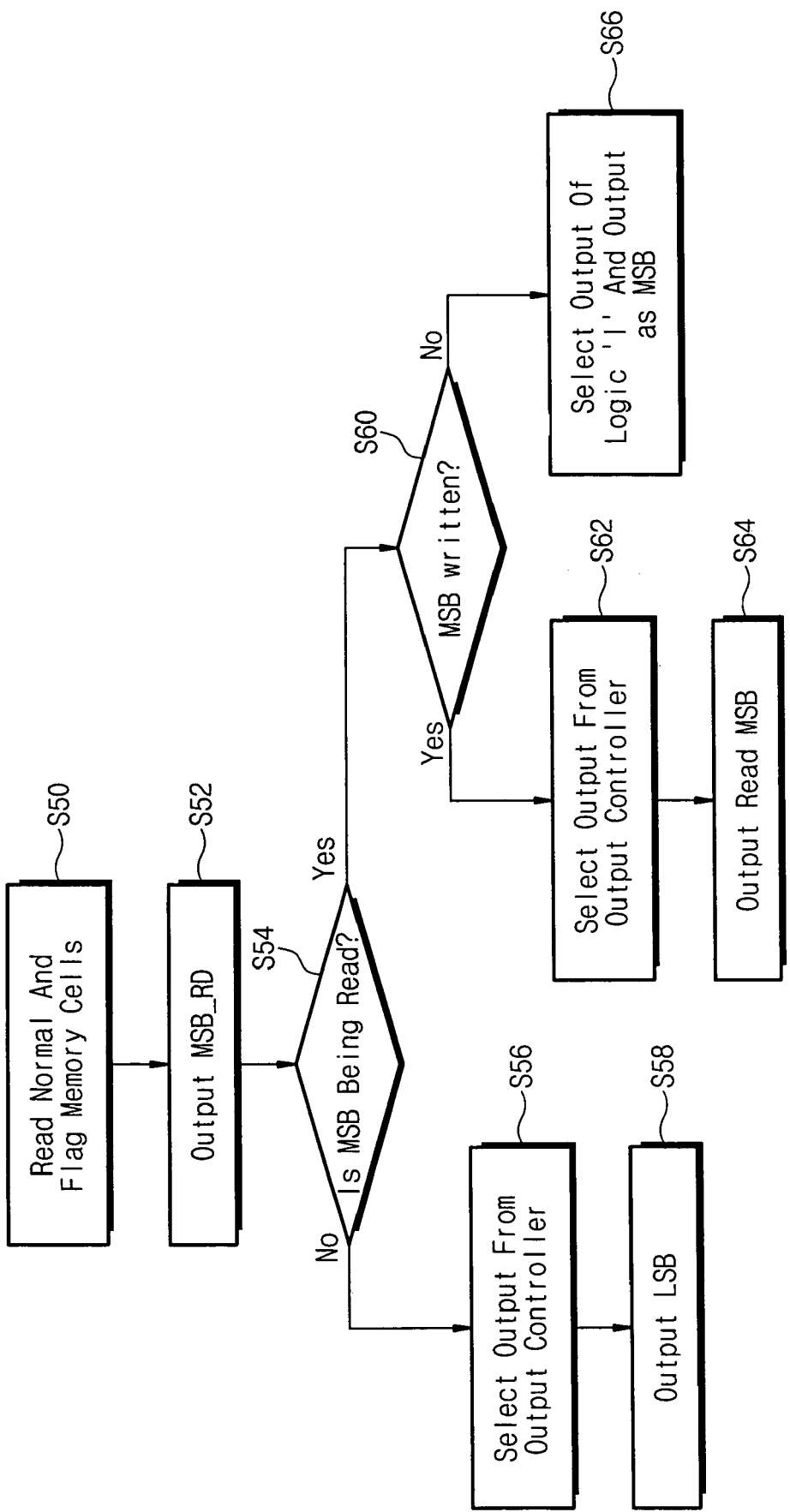
FIG. 14 illustrates a flow chart of the method of reading a MSB in the nonvolatile semiconductor memory device of FIG. 13 according to an embodiment of the present invention.

FIG. 14 is a flow chart illustrating a method of operating the nonvolatile semiconductor memory device during a read operation according to an embodiment of the present invention. As will be appreciated, the control logic 500 receives a read command and address information, the memory cell or cells identified by the address information will have their LSB read first as described above with respect to FIG. 9. To read the LSB, in step S50, the control logic 500 reads the normal memory cells being addressed as well as the corresponding flag memory cells. Also, the control logic 500 outputs the MSB read signal MSB_RD to indicating that the MSB is not being read in step S52. It will be understood that steps S50 and S52 may occur concurrently.

Next, in step S54, the signal generator 530' determines from the MSB read signal MSB_RD whether the MSB is being read. If not, then the signal generator 530' generates a selection signal such that the selector 550 selects the output from the output controller 400 in step S56. Accordingly, in step S58, the read LSB is output.

When the MSB is being read, the control logic 500 will have output the MSB read signal MSB_RD to indicate reading of the MSB.

If in step S54, the signal generator 530' determines from the MSB read signal MSB_RD that the MSB is being read, then in step S60, the signal generator 530' determines from the flag data read in step S50 if the MSB was previously written. If so, then the signal generator 530' generates a selection signal such that the selector 550 selects the output from the output controller 400 in step S62. Accordingly, in step S64, the read MSB is output.

However, if in step S60 the read flag data indicates the MSB has not been written, the signal generator 530' generates a selection signal such that the selector 550 selects and outputs logic 1 in step S66. Again, whether the selector 550 is supplied with a logic 1 or a 0 depends on the MLC scheme adopted for the nonvolatile semiconductor memory device. Here, the MLC scheme of FIGS. 4A-4B was assumed, where outputting a MSB of 1 does not change the MLC state obtained in reading the LSB.

Although the present invention has been described in connection with several teaching embodiments, it is not limited thereto. It will be apparent to those skilled in the art that various substitutions, modifications and changes may be thereto without departing from the scope of the invention as defined by the following claims.

We claim:

1. A non-volatile memory device, comprising:
a plurality of normal memory cells;
at least one flag memory cell associated with one of the plurality of normal memory cells;
a normal page buffer configured to store data read from one of the plurality of normal memory cells, the normal page buffer including a main latch storing the read data; and
a control circuit configured to selectively change data stored in the main latch during a read operation based on a state of the flag memory cell,
wherein the plurality of normal memory cells have multiple states such that each state represents at least, a least significant bit and a next most significant bit,
wherein the read operation includes a least significant bit read operation and then a next most significant bit read operation, and the control circuit is configured to selectively change data stored in the main latch as a result of the next most significant bit read operation.

2. The device of claim 1, wherein the control circuit is configured to change the data stored in the main latch if the flag memory cell is in an erased state.

3. The device of claim 2, wherein the flag memory cell is in an erased state if a next most significant bit write operation for the associated normal memory cell has not taken place.

4. The device of claim 2, wherein the control circuit is configured not to change the data stored in the first latch if the flag memory cell is in a non-erased state.

5. The device of claim 4, wherein the flag memory cell is in an erased state if a next most significant bit write operation for the associated normal memory cell has not taken place, and the flag memory cell is in a non-erased state if a next most significant bit write operation for the associated normal memory cell has taken place.

6. The device of claim 1, wherein the control circuit is configured not to change the data stored in the main latch if the flag memory cell is in a non-erased state.

7. The device of claim 6, wherein the flag memory cell is in a non-erased state if a next most significant bit write operation for the associated normal memory cell has taken place.

8. The device of claim 1, wherein the control circuit changes the data stored in the main latch by resetting the main latch.

9. The device of claim 1, wherein the flag memory cell is in an erased state if a next most significant bit write operation for the associated normal memory cell has not taken place, and the flag memory cell is in a non-erased state if a next most significant bit write operation for the associated normal memory cell has taken place.

10. A non-volatile memory device, comprising:
a plurality of normal memory cells;
at least one flag memory cell associated with one of the plurality of normal memory cells;
a normal page buffer configured to store data for writing into one of the plurality of normal memory cells and configured to store data read from one of the plurality of normal memory cells, the normal page buffer including a main latch and a secondary latch, the main latch supplying write data to the plurality of normal memory cells during a write operation; and
a control circuit configured to selectively set data stored in the main latch during a read operation based on a state of the flag memory cell,
wherein the plurality of normal memory cells have multiple states such that each state represents at least, a least significant bit and a next most significant bit,
wherein the read operation includes a least significant bit read operation and then a next most significant bit read operation, and the control circuit is configured to selectively change data stored in the main latch as a result of the next most significant bit read operation.

11. A method of reading data from a normal memory cell, each normal memory cell having multiple states such that each state represents at least, a least significant bit and a next most significant bit, the method comprising:
storing data read from one of a plurality of normal memory cells in a page buffer connected to the plurality of normal memory cells, the page buffer including a main latch storing the read data; and
selectively changing data stored in the main latch based on a state of a flag memory cell associated with the read normal memory cell,
wherein the storing read data includes storing the least significant bit read data, and storing the next most significant bit read data,
wherein the selectively changing data is executed as a result of the storing the next most significant bit read data.

* * * * *